United States Patent
Park et al.

(10) Patent No.: US 11,600,893 B2
(45) Date of Patent: Mar. 7, 2023

(54) BATTERY SYSTEM

(71) Applicant: SK INNOVATION CO., LTD., Seoul (KR)

(72) Inventors: Byoung Kyu Park, Daejeon (KR); Seok Min Kim, Daejeon (KR); Seon Yong Kim, Daejeon (KR); Ha Chul Jeong, Daejeon (KR)

(73) Assignee: SK ON CO., LTD., Seoul (KR)

( * ) Notice: Subject to any disclaimer, the term of this patent is extended or adjusted under 35 U.S.C. 154(b) by 461 days.

(21) Appl. No.: 16/723,488

(22) Filed: Dec. 20, 2019

(65) Prior Publication Data

US 2020/0203702 A1 Jun. 25, 2020

(30) Foreign Application Priority Data

Dec. 21, 2018 (KR) .................. 10-2018-0167300

(51) Int. Cl.
| | |
|---|---|
| *H01M 50/581* | (2021.01) |
| *H02J 7/00* | (2006.01) |
| *H01M 10/42* | (2006.01) |
| *H01M 10/48* | (2006.01) |

(52) U.S. Cl.
CPC ....... *H01M 50/581* (2021.01); *H01M 10/425* (2013.01); *H01M 10/4207* (2013.01); *H01M 10/482* (2013.01); *H02J 7/0013* (2013.01); *H02J 7/0047* (2013.01); *H02J 7/00304* (2020.01); *H01M 2010/4271* (2013.01); *H01M 2200/103* (2013.01)

(58) Field of Classification Search
None
See application file for complete search history.

(56) References Cited

FOREIGN PATENT DOCUMENTS

| EP | 1967861 A2 | 9/2008 |
|---|---|---|
| JP | 2018-014301 | 1/2018 |
| JP | 2018014301 A | 1/2018 |
| KR | 10-1047831 B1 | 7/2011 |
| KR | 10-1201569 B1 | 11/2012 |
| KR | 10-2018-0000232 A | 1/2018 |

OTHER PUBLICATIONS

Extended European Search Report dated Apr. 3, 2020.

*Primary Examiner* — Carmen V Lyles-Irving
(74) *Attorney, Agent, or Firm* — IP & T Group LLP

(57) ABSTRACT

A battery system according to the present invention includes: a plurality of battery cells electrically connected to each other; cell voltage sensing lines connected to ends of the battery cells, respectively; a battery management system sensing voltages of the battery cells through the respective cell voltage sensing lines; fuses connected to the cell voltage sensing lines, respectively, to cut off a flow of an excessive current exceeding a rated current when the excessive current flows through the cell voltage sensing lines; and emergency preventing switches connected to the cell voltage sensing lines, respectively, so as to be turned on at the time of sensing the voltage of the battery cell, and turned off in a case when a short circuit between the cell voltage sensing lines occurs.

6 Claims, 3 Drawing Sheets

BATTERY SYSTEM

CROSS-REFERENCE TO RELATED APPLICATIONS

This application claims priority under 35 U.S.C. § 119 to Korean Patent Application No. 10-2018-0167300 filed on Dec. 21, 2018, in the Korean Intellectual Property Office, the disclosure of which is incorporated herein by reference in its entirety.

TECHNICAL FIELD

The following disclosure relates to a battery system which prevents emergencies such as ignition in a battery management system even when a short circuit occurs between cell voltage sensing lines.

BACKGROUND

A generally used battery system includes a plurality of battery cells electrically connected to each other and a battery management system sensing voltages of the battery cells and performing voltage balancing of the battery cells to significantly reduce a difference in voltage between the battery cells. Cell voltage sensing lines are connected to ends of the battery cells, respectively, to sense the voltage of each of the battery cells, and the battery management system senses the voltage of each of the battery cells through the respective cell voltage sensing lines. Further, the cell voltage sensing line and the battery management system may be connected to each other through a connector. In such a battery system, however, since the battery cell stores a very large amount of energy in a limited space, there is a risk such as ignition, and thus a safety design of the battery system is significantly important.

Each of the cell voltage sensing lines connected between the battery cell and the battery management system has its own potential, and a short circuit should not occur between the cell voltage sensing lines for the safety of the battery system. However, for example, in a case of immersing the battery cell in cooling water to cool the battery cell, a short circuit may occur between the cell voltage sensing lines due to foreign substances included in the cooling water. Further, in a case when the short circuit occurs between the cell voltage sensing lines as described above, an excessive current flows through the cell voltage sensing lines, which may cause emergencies such as heat generation, smoke generation, ignition, and the like.

In order to prevent such a short circuit accident, according to the related art, a method in which a fuse 40 is connected to a cell voltage sensing line 20 as illustrated in FIG. 1 to cut off a flow of an excessive current exceeding a rated current when the excessive current flows through the cell voltage sensing line 20 has been used.

More specifically, the battery system according to the related art, which is illustrated in FIG. 1, includes a plurality of battery cells 10 electrically connected to each other, cell voltage sensing lines 20 connected to ends of the battery cells 10, respective battery management system 30 sensing voltages of the battery cells 10 through the cell voltage sensing lines 20, and fuses 40 each connected to the cell voltage sensing line 20 and cutting off a flow of an excessive current exceeding the rated current when the excessive current flows through the cell voltage sensing line 20 due to the short circuit between the cell voltage sensing lines 20.

As described above, the cell voltage sensing each lines 20 has its own potential, and it is assumed in FIG. 1 that a potential of the cell voltage sensing line increases from a cell voltage sensing line cs1 to a cell voltage sensing line cs8.

In this case, if the cell voltage sensing line cs2 having a relatively lower potential and the cell voltage sensing line cs7 having a relatively higher potential are short-circuited to each other, an excessive current exceeding the rated current flows through the cell voltage sensing lines cs2 and cs7, such that any one of a fuse F2 and a fuse F7 is blown first, the fuse F2 being connected to the cell voltage sensing line cs2 and the fuse F7 being connected to the cell voltage sensing line cs7. At this time, in a case when specifications (for example, a fusing time) of two fuses are the same as each other, any one of the two fuses is blown first, but it is hard to know which fuse is to be blown first.

Regardless of whether the fuse F2 connected to the cell voltage sensing line cs2 having the relatively lower potential is blown first or the fuse F7 connected to the cell voltage sensing line cs7 having the relatively, higher potential is blown first, once any one fuse blown first, an excessive voltage and a reverse voltage are applied to a port for monitoring the voltage of the battery cell in the battery management system.

FIG. 2 is a diagram illustrating ports for monitoring the voltage of the battery cell in the battery management system. Although only a Vin1 port and a Vin2 port are illustrated in FIG. 2 for convenience of explanation, a Vin3 port, a Vin4 port, Vin5 port, Vin6 port, and a Vin7 port also each have the same configuration as that of the Vin1 port or the Vin2 port.

As illustrated in FIG. 2, the battery management system includes a balancing resistor Rb1 and a balancing switch SWb1 connected to the balancing resistor Rb1 in series between the cell voltage sensing lines cs1 and cs2, and a balancing resistor Rb2 and a balancing switch SWb2 connected to the balancing resistor Rb2 series between the cell voltage sensing lines cs2 and cs3, in order to perform the voltage balancing of the battery cells. Further, the balancing switches SWb1 and SWb2 may each include a field effect transistor (FET) and a clamping diode connected to the FET.

In a case when the cell voltage sensing line cs2 and the cell voltage sensing line cs7 are short-circuited to each other as illustrated in FIG. 1, if the fuse F7 corrected to the cell voltage sensing line cs7 having the relative higher potent blown first, a voltage at a point A becomes V1, Vin7 is as represented by the following Expression 1, and Vin6 is as represented by the following Expression 2.

$$Vin7 = V7 + V6 + V5 + V4 + V3 + V2 \qquad \text{[Expression 1]}$$

$$Vin6 = -(V5 + V4 + V3 + V2) \qquad \text{[Expression 2]}$$

As can be appreciated from Expressions 1 and 2, Vin7 V7 before the fuse F7 is blown, and becomes a voltage higher than V7, which is an excessive voltage, once the fuse F7 is blown, and Vin6 is V6 before the fuse F7 is blown, and becomes a (−) voltage, which is a reverse voltage, once the fuse F7 is blown.

Meanwhile, the fuse F2 connected to the cell voltage sensing line cs2 having the relatively lower potential is blown first, a voltage at a point B becomes V6+V5+V4+V3+V2+V1, Vin1 is as represented by the following Expression 3, and Vin2 is as represented by the following Expression 4.

$$Vin1 = V6 + V5 + V4 + V2 + V1 \qquad \text{[Expression 3]}$$

$$Vin2 = -(V6 + V5 + V4 + V3) \qquad \text{[Expression 4]}$$

As can be appreciated from Expressions 3 and 4, Vin1 is V1 before the fuse F2 is blown, and becomes a voltage higher than V1, which is an excessive voltage, once the fuse F2 is blown, and Vin2 is V2 before the fuse F2 is blown, and becomes a (−) voltage, which is a reverse voltage, once the fuse F2 is blown.

As such, in a case when an excessive voltage is applied to the Vin1 port, the reverse voltage applied to the clamping diode of the balancing switch SWb1, such that the clamping diode may be damaged. In this case, a current does not flow through the Vin1 port. In contrast, in a case when a reverse voltage is applied to the Vin2 port, a current flows through the clamping diode of the balancing switch SWb2, and the current may cause heat generation, smoke generation, or ignition at the balancing resistor Rb2.

That is, the battery system according to the related art intends to prevent emergencies by using the fuse, but has a problem that heat generation, smoke generation, or ignition occurs at the balancing resistor in the battery management system in a case when a reverse voltage is applied between the cell voltage sensing lines due to a short circuit between the cell voltage sensing lines.

RELATED ART DOCUMENT

Patent Document (Patent Document 1) Japanese Patent Laid-Open Publication No. 2018-14301 (published on Jan. 25, 2018)

SUMMARY

An embodiment of the present invention is directed to providing a battery system which prevents emergencies such as heat generation, smoke generation, or ignition in a battery management system even when a short circuit occurs between cell voltage sensing lines.

In one general aspect, a battery system includes: a plurality of battery cells electrically connected to each other; cell voltage sensing lines connected to ends of the battery cells, respectively; a battery management system sensing voltages of the battery cells through the respective cell voltage sensing lines; fuses connected to the cell voltage sensing lines, respectively, to cut off a flow of an excessive current exceeding a rated current when the excessive current flows through the cell voltage sensing lines; and emergency preventing switches connected to the cell voltage sensing lines, respectively, so as to be turned on at the time of sensing the voltage of the battery cell, and turned off in a case when a short circuit between the cell voltage sensing lines occurs.

The emergency preventing switch may be connected to the fuse in series and may be connected between the fuse and the battery management system.

A gate of the emergency preventing switch connected to one cell voltage sensing line may be connected to another cell voltage sensing line having a lower potential than that of the one cell voltage sensing line, such that the emergency preventing switch is turned on when a low voltage is applied to the gate of the emergency preventing switch, and the emergency preventing switch is turned off when a high voltage is applied to the gate of the emergency preventing switch.

In a case when the short circuit between the cell voltage sensing lines occurs, if the fuse connected to one cell voltage sensing line having a relatively lower potential among the cell voltage sensing lines short-circuited to each other is blown first, a high voltage may be sequentially applied to gates of the emergency preventing switches connected to other cell voltage sensing lines each having a higher potential than that of the one cell voltage sensing line having the relatively lower potential, such that the emergency preventing switches connected to the other cell voltage sensing lines each having the higher potential, respectively, are sequentially turned off.

A fusing time of the fuse connected to one cell voltage sensing line may be equal to or longer than a fusing time of the fuse connected to another cell voltage sensing line having a lower potential than that of the one cell voltage sensing line.

A fusing time of the fuse connected to the cell voltage sensing line having the highest potential among the cell voltage sensing lines may be longer than a fusing time of the fuse connected to the cell voltage sensing line having the lowest potential.

Other features and aspects will be apparent from the following detailed description, the drawings, and the claims.

DETAILED DESCRIPTION OF MAIN ELEMENTS

1, 1000: Battery system
10, 100: Battery cell
20, 200: Cell voltage sensing line
30, 300: Battery management system
40, 400: Fuse
500: Emergency preventing switch

DETAILED DESCRIPTION OF EMBODIMENTS

Hereinafter, the present invention will be described in detail with reference to the accompanying drawings. A detailed description for the well-known functions and configurations that may unnecessarily make the gist of the present invention unclear will be omitted.

Figure 3:
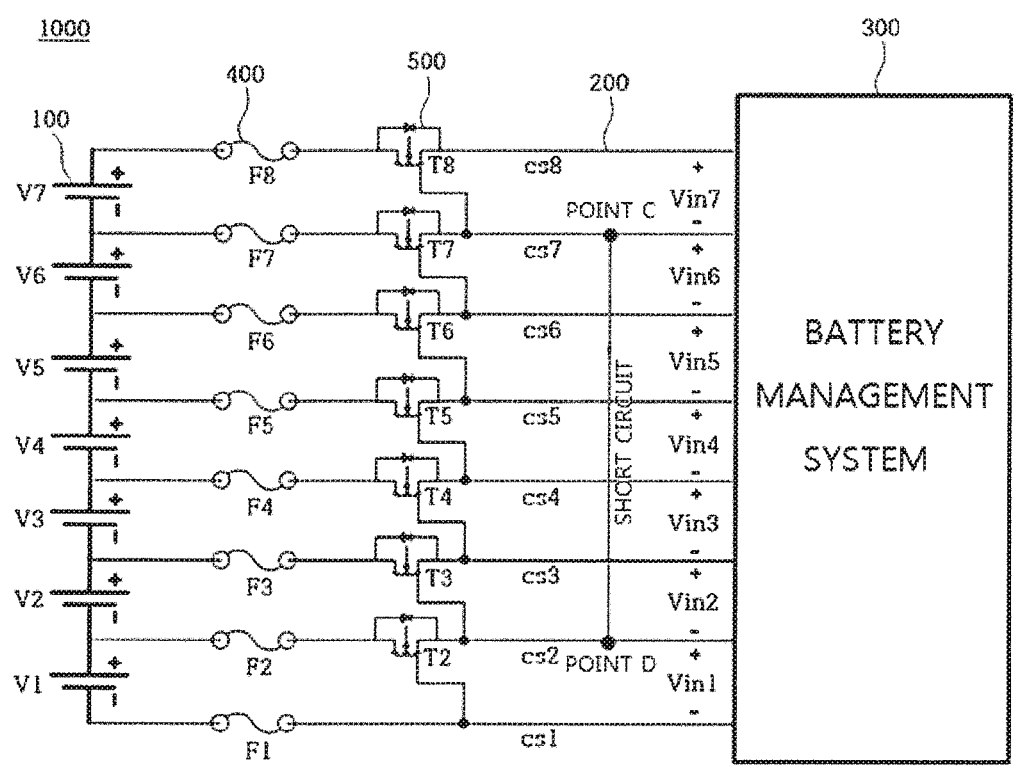
FIG. 3 is a diagram illustrating a battery system according to an exemplary embodiment of the present invention.

FIG. 3 is a diagram illustrating a battery system according to an exemplary embodiment of the present invention. As illustrated in FIG. 3, the battery system according to the exemplary embodiment of the present invention includes battery cells 100, cell voltage sensing lines 200, a battery management system 300, fuses 400, and emergency preventing switches 500.

The number of battery cells 100 is plural and the battery cells 100 are electrically connected to each other. The cell voltage sensing lines 200 are connected to ends of the battery cells 100, respectively. Although FIG. 3 illustrates configuration of the battery system in which a plurality of battery cells 100 are electrically connected to each other in series, a configuration of the battery system in which plurality of battery cells 100 are connected in series and in parallel is also possible.

Figure 1:
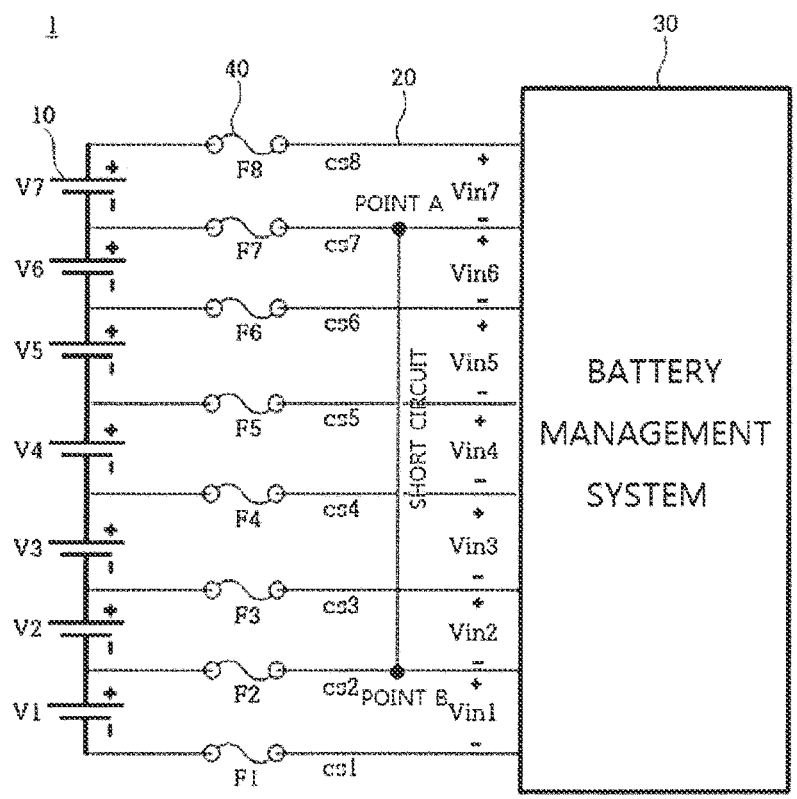
FIG. 1 is a diagram illustrating a battery system according to the related art.
Figure 2:
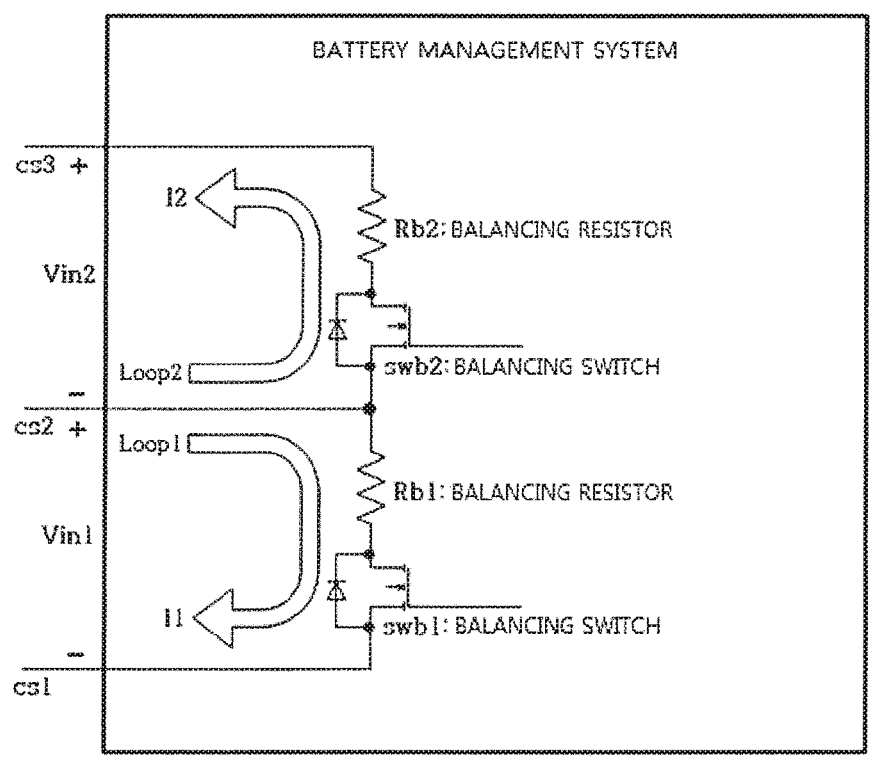
FIG. 2 is a diagram illustrating a port for monitoring a voltage of a battery cell in a battery management system.

One end of the cell voltage sensing line 200 is connected to a cathode or an anode of the battery 100, and the other end of the cell voltage sensing line 200 is connected to the battery management system 300. Each of the cell voltage sensing lines 200 has its own potential, and in the following description, it is assumed that a potential of the cell voltage sensing line increases from a cell voltage sensing line cs1 to a cell voltage sensing line cs8. POW The battery management system 300 may sense voltages of the battery cells 100 through the cell voltage sensing lines 200, and perform voltage balancing of the battery cells 100 by using the sensed voltage of the battery cell 100. As described with reference to FIG. 2, the battery management system 300 includes a balancing resistor Rb1 and a balancing switch SWb1 connected to the balancing resistor Rb1 in series between the cell voltage sensing lines cs1 and cs2, and a balancing resistor Rb2 and a balancing switch SWb2 connected to the balancing resistor Rb2 in series between the cell voltage sensing lines cs2 and cs3, in order to perform the voltage balancing of the battery cells 100. The balancing switches SWb1 and SWb2 may each include a field effect transistor (FET) and a clamping diode connected to the FET.

The fuse 400 is connected to the cell voltage sensing line 200, and functions to cut off a flow of an excessive current exceeding a rated current when the excessive current flows through the cell voltage sensing line 200.

The emergency preventing switch 500 is also connected to the cell voltage sensing line 200, and connected to the fuse 400 in series. Further, it is preferable that the emergency preventing switch 500 is connected between the fuse 400 and the battery management system 300.

The emergency preventing switch 500 may include a FET and a clamping diode connected to the FET like the balancing switch, and according to an exemplary embodiment, the emergency preventing switch 500 may be a p-channel FET.

A cathode of the clamping diode constituting the emergency preventing switch 500 is connected to the cathode of the battery cell 100 through the fuse 400, and an anode of the clamping diode is connected to the battery management system 300.

Further, a gate of the FET constituting the emergency preventing switch 500 is connected to an adjacent cell voltage sensing line having a low potential. Specifically, a gate of a FET constituting an emergency preventing switch T2 connected to the cell voltage sensing line cs2 is connected to the cell voltage sensing line cs1 having a lower potential than that of the cell voltage sensing line cs2. Further, a gate of a FET constituting an emergency preventing switch T3 connected to the cell voltage sensing line cs3 is connected to the cell voltage sensing line cs2 having a lower potential than that of the cell voltage sensing line cs3. In this manner, each of gates of FETs constituting emergency preventing switches T4, T5, T6, T7, and T8, respectively, is connected to an adjacent cell voltage sensing line cs3, cs4, cs5, cs6, or cs7 having a low potential. As a result, a low voltage is applied to the gate of the FET and the emergency preventing switch 500 is turned on at the time of a normal operation in which a short circuit between the cell voltage sensing lines 200 does not occur.

Once the emergency preventing switch 500 is turned on, the battery management system 300 may sense the voltage of the battery cell 100 through the cell voltage sensing line 200, and detect occurrence of voltage unbalance between the battery cells 100 by using the sensed voltage of the battery cell 100. In this case, the battery management system 300 performs the voltage balancing of the battery cell 100 by using a balancing resistor Rb and a balancing switch SWb.

Meanwhile, if the cell voltage sensing line cs2 having a relatively lower potential and the cell voltage sensing line cs7 having relatively higher potential are short-circuited to each other as illustrated in FIG. 3, an excessive current exceeding the rated current flows through the cell voltage sensing lines cs2 and cs7, ouch that any one of a fuse F2 and a fuse F7 is blown first, the fuse F2 being connected to the cell voltage sensing line cs2 and the fuse F7 being connected to the cell voltage sensing line cs7.

If the Fuse F7 connect d to the cell voltage sensing line cs7 having the relatively higher potential, rather than the fuse connected to the cell voltage sensing line cs2 having the relatively lower potential, is blown first, a voltage at a point C becomes V1, Vin7 is as represented by the following Expression 5, and Vin6 is as represented by the following Expression 6.

$$Vin7 = V7 + V6 + V5 + V4 + V3 + V2 \qquad \text{[Expression 5]}$$

$$Vin6 = -(V5 + V4 + V3 + V2) \qquad \text{[Expression 6]}$$

As can be appreciated from Expressions 5 and 6, Vin7 is V7 before the fuse F7 is blown, and becomes a voltage higher than V7, which is an excessive voltage, once the fuse F7 is blown, and Vin6 is V6 before the fuse F7 is blown, and becomes a (−) voltage, which is a reverse voltage, once the fuse F7 is blown.

In contrast, if the fuse F2 connected to the cell voltage sensing line cs2 having the relatively lower potential, rather than the fuse F7 connected to the cell voltage sensing line cs7 having the relatively higher potential, is blown first, voltage at a point D becomes V6+V5++V4+V3+V2+V1.

As described above, the gates of the FETs respectively constituting the emergency preventing switches T2, T3, T4, T5, T6, T7, and T8 are respectively connected to the cell voltage sensing lines cs1, cs2, cs3, cs4, cs5, cs6, and cs7 each having a lower potential than that of each of the cell voltage sensing line cs2, cs3, cs4, cs5, cs6, cs7, and cs8 to which the emergency preventing switches T2, T3, T4, T5, T6, T7, and T8 are connected, respectively.

Therefore, in a case when the cell voltage sensing line cs2 and the cell voltage sensing line cs7 are short-circuited to each other, and the fuse F2 connected to the cell voltage sensing line cs2 having the relatively lower potential is blown first, a high voltage is sequentially applied to the gates of the emergency preventing switches T3, T4, T5, T6, T7, and T8 respectively connected to the cell voltage sensing lines cs3, cs4, cs5, cs6, cs7, and cs8 each having a higher potential than that of the cell voltage sensing line cs2, such that the emergency preventing switches T3, T4, T5, T6, T7, and T8 are sequentially turned off. Further, once the emergency preventing switches T3, T4, T5, T6, T7, and T8 are sequentially turned off, a current does not flow through the cell voltage sensing lines cs3, cs4, cs5, cs6, cs7, and cs8, such that a reverse voltage is not applied between the cell voltage sensing lines.

If the fuse F2 connected to the cell voltage sensing line cs2 having the relatively lower potential, rather than the fuse F7 connected to the cell voltage sensing line cs7 having the relatively higher potential, is blown first, Vin1 is as represented by the following Expression 7, and Vin2 as required by the following Expression 8.

$$Vin1 = V6 + V5 + V4 + V3 + V2 + V1 \qquad \text{[Expression 7]}$$

$$Vin2 = 0 \qquad \text{[Expression 8]}$$

As can be appreciated from Expressions 7 and 8, Vin1 is V1 before the fuse F2 is blown, and becomes a voltage higher than V1, which is an excessive voltage, once the fuse F2 is blown, and Vin2 is V2 before the fuse F2 is blown, and becomes 0 V once the fuse F2 is blown.

That is, it may be appreciated that in a case when the cell voltage sensing line cs2 having the relatively lower potential and the cell voltage sensing line cs7 having the relatively higher potential are short-circuited to each other, if the fuse F2 connected to the cell voltage sensing line cs2 having the relatively lower potential, rather than the fuse F7 connected to the cell voltage sensing line cs7 having the relatively higher potential, is blown first, a reverse voltage is not applied between the cell voltage sensing lines cs2 and cs3.

In order to prevent a reverse voltage from being applied between cell voltage sensing lines by making a fuse connected to a cell voltage sensing line having a relatively lower potential, rather than a fuse connected to a cell voltage sensing line having a relatively higher potential, be blown first, a fusing time of the fuse connected to the cell voltage sensing line having the relatively higher potential needs to be longer than a fusing time of the fuse connected to the cell voltage sensing line having the relatively lower potential. Here, a fusing time of a fuse means a time taken for the fuse to blow in a case when an excessive current exceeding the rated current flows through the fuse.

However, in a case when a current flowing due to the reverse voltage applied between the cell voltage sensing lines is lower than a rated current allowed for the balancing resistor Rb in the battery management system 300, emergencies such as ignition do not occur in the balancing resistor Rb regardless of whether the fuse connected to the cell voltage sensing line having the relatively lower potential is blown first or the fuse connected to the cell voltage sensing line having the relatively higher potential is blown first. Therefore, in this case, the fusing time of the fuse connected to the cell voltage sensing line having the relatively higher potential may be set to be the same as the fusing time of the fuse connected to the cell voltage sensing line having the relatively lower potential.

In consideration of this fact, the fusing time of the fuse may be set as represented by the following Expression in order to prevent the reverse voltage from being applied between the cell voltage sensing lines.

$$Tm8 \geq Tm7 \geq Tm6 \geq Tm5 \geq Tm4 \geq Tm3 \geq Tm2 \geq Tm1 \qquad \text{[Expression 9]}$$

Here, $Tm1$ is a fusing time of a fuse F1, $Tm2$ is a fusing time of the fuse F2, $Tm3$ is a fusing time of a fuse F3, $Tm4$ is a fusing time of a fuse F4, $Tm5$ is a fusing time of a fuse F5, $Tm6$ is a fusing time of a fuse F6, $Tm7$ is a fusing time of the fuse F7, and $Tm8$ is a fusing time of a fuse F8.

However, in a case when the fusing times of the fuses are the same as one another in Expression 9, it becomes not important whether fuse connected to cell voltage sensing line having the relatively lower potential is blown first or the fuse connected to the cell voltage sensing line having the relatively higher potential is blown first. Therefore, the fusing time of the fuse F8 connected to the cell voltage sensing line cs8 having the highest potential among the cell voltage sensing lines cs1, cs2, cs3, cs4, cs5, cs6, cs7, and cs8 needs to be longer than the fusing time of the fuse F1 connected to the cell voltage sensing line cs1 having the lowest potential, which is represented by the following Expression 10.

$$Tm8 > Tm1 \qquad \text{[Expression 10]}$$

As described above, according to the present invention, in a case when a short circuit occurs between the cell voltage sensing lines, the emergency preventing switch connected to the cell voltage sensing line is turned off, such that a current caused by a reverse voltage does not flow through the balancing resistor in the battery management system. As a result, it is possible to prevent emergencies such as heat generation, smoke generation, or ignition in the battery management system.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the technical idea of the present invention should be understood only the following claims, and all of the equivalences and equivalent modifications to the claims are intended to fall within the scope of the technical idea of the present invention.

What is claimed is:

1. A battery system comprising:
    a plurality of battery cells electrically connected to each other;
    cell voltage sensing lines connected to ends of the battery cells, respectively;
    a battery management system sensing voltages of the battery cells through the respective cell voltage sensing lines;
    fuses connected to the cell voltage sensing lines, respectively, to cut off a flow of an excessive current exceeding a rated current when the excessive current flows through the cell voltage sensing lines due to a short circuit between the cell voltage sensing lines; and
    emergency preventing switches connected to the cell voltage sensing lines, respectively, so as to be turned on at the time of sensing the voltage of the battery cell, and turned off in a case when the short circuit between the cell voltage sensing lines occurs,
    wherein the emergency preventing switch is connected between the fuse and the battery management system to be turned off when any fuse provided in the corresponding line is first disconnected when a short circuit occurs between the cell voltage sensing lines.

2. The battery system of claim 1, wherein the emergency preventing switch is connected to the fuse in series.

3. The battery system of claim 1, wherein a gate of the emergency preventing switch connected to one cell voltage sensing line is connected to another cell voltage sensing line having a lower potential than that of the one cell voltage sensing line, such that the emergency preventing switch is turned on when a low voltage is applied to the gate of the emergency preventing switch, and the emergency preventing switch is turned off when a high voltage is applied to the gate of the emergency preventing switch.

4. The battery system of claim 3, wherein in a case when the short circuit between the cell voltage sensing lines occurs, if the fuse connected to one cell voltage sensing line having a lower potential among the cell voltage sensing lines short-circuited to each other is blown first, a high voltage is sequentially applied to gates of the emergency preventing switches connected to other cell voltage sensing lines each having a higher potential than that of the one cell voltage sensing line having the lower potential, such that the emergency preventing switches connected to the other cell voltage sensing lines each having the higher potential, respectively, are sequentially turned off.

5. The battery system of claim 1, wherein a fusing time of the fuse connected to one cell voltage sensing line is equal to or longer than a fusing time of the fuse connected to another cell voltage sensing line having a lower potential than that of the one cell voltage sensing line.

6. The battery system of claim 5, wherein a fusing time of the fuse connected to the cell voltage sensing line having the highest potential among the cell voltage sensing lines is longer than a fusing time of the fuse connected to the cell voltage sensing line having the lowest potential.

\* \* \* \* \*